(12) United States Patent
Jiang et al.

(10) Patent No.: US 9,075,806 B2
(45) Date of Patent: Jul. 7, 2015

(54) ALIGNMENT AND RE-ASSOCIATION OF METADATA FOR MEDIA STREAMS WITHIN A COMPUTING DEVICE

(75) Inventors: Wenyu Jiang, Singapore (SG); Regunathan Radhakrishnan, San Bruno, CA (US); Claus Bauer, Beijing (CN)

(73) Assignee: DOLBY LABORATORIES LICENSING CORPORATION, San Francisco, CA (US)

( * ) Notice: Subject to any disclaimer, the term of this patent is extended or adjusted under 35 U.S.C. 154(b) by 740 days.

(21) Appl. No.: 13/402,718

(22) Filed: Feb. 22, 2012

(65) Prior Publication Data

US 2012/0215329 A1 Aug. 23, 2012

Related U.S. Application Data

(60) Provisional application No. 61/445,347, filed on Feb. 22, 2011.

(51) Int. Cl.
*G06F 17/00* (2006.01)
*G06F 17/30* (2006.01)
*G06F 3/16* (2006.01)
*H03G 3/30* (2006.01)

(52) U.S. Cl.
CPC .... *G06F 17/30017* (2013.01); *G06F 17/30743* (2013.01); *G06F 3/16* (2013.01); *H03G 3/3005* (2013.01)

(58) Field of Classification Search
CPC .......... G06F 17/30017; G06F 17/3074; G06F 17/3002; H03G 3/3005; H03G 3/20; G11B 27/10; G11B 27/00; G11H 27/10; G11H 27/00
USPC .......................................................... 709/23
See application file for complete search history.

(56) References Cited

U.S. PATENT DOCUMENTS

2008/0013614 A1\* 1/2008 Fiesel et al. .................. 375/224
2010/0014692 A1\* 1/2010 Schreiner et al. ............. 381/119

FOREIGN PATENT DOCUMENTS

| EP | 1652385 | 5/2006 |
|---|---|---|
| WO | 2009/032707 | 3/2009 |
| WO | 2010/021966 | 2/2010 |

\* cited by examiner

*Primary Examiner* — Fan Tsang
*Assistant Examiner* — David Siegel
(74) *Attorney, Agent, or Firm* — Wong & Rees LLP

(57) ABSTRACT

Techniques for re-associating dynamic metadata with media data are provided. A media processing system creates, with a first media processing stage, binding information comprising dynamic metadata and a time relationship between the dynamic metadata and media data. The binding information may be derived from the media data. While the first media processing stage delivers the media data to a second media processing stage in a first data path, the first media processing stage passes the binding information to the second media processing stage in a second data path. The media processing system re-associates, with the second media processing stage, the dynamic metadata and the media data using the binding information.

34 Claims, 4 Drawing Sheets

Fingerprints of decoded audio sample and metadata in binding information, received via the second data path Fingerprints of decoded audio received via the first data path (e.g., sound API)

ALIGNMENT AND RE-ASSOCIATION OF METADATA FOR MEDIA STREAMS WITHIN A COMPUTING DEVICE

CROSS REFERENCE TO RELATED APPLICATIONS

This application claims priority to related, co-pending U.S. Provisional Patent Application No. 61/445,347 filed 22 Feb. 2011, hereby incorporated by reference in its entirety.

TECHNICAL FIELD

The present invention relates generally to media, and in particular, to metadata for media streams in computing devices.

BACKGROUND

Audio processing modules are typically implemented as parts of a sound card device driver in a computing device. For example, in some operating systems such as the Windows Operating System from Microsoft Corp., in Seattle, Wash., these processing modules may be implemented as audio processing objects (APOs).

After audio streams have been decoded, metadata obtained by a decoder could be used to enhance the playback experience of the audio streams. Unfortunately, the standard sound APIs in many operating systems typically support only the passing of audio samples to audio processing modules. Thus, the audio processing modules would not have the metadata associated with the audio samples to enhance media experience when only the audio samples are received from a decoder, but rather would have to recompute and regenerate a limited amount of the metadata from the received audio samples at a great cost of CPU complexity and/or delay.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section. Similarly, issues identified with respect to one or more approaches should not assume to have been recognized in any prior art on the basis of this section, unless otherwise indicated.

BRIEF DESCRIPTION OF DRAWINGS

The present invention is illustrated by way of example, and not by way of limitation, in the figures of the accompanying drawings and in which like reference numerals refer to similar elements and in which.

DESCRIPTION OF EXAMPLE EMBODIMENTS

Figure 1:
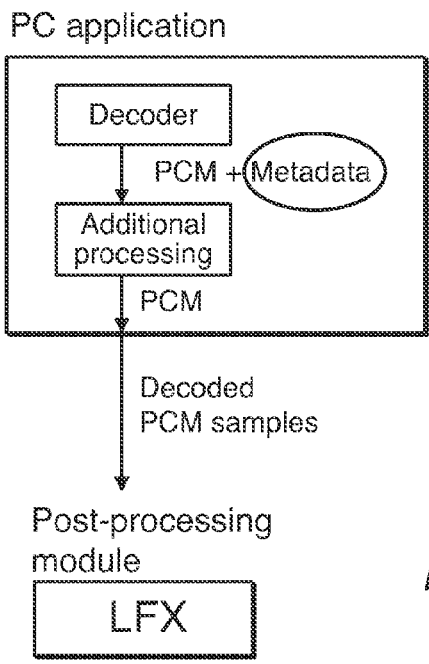
FIG. 1 illustrates example audio processing modules.

Example possible embodiments, which relate to re-associating metadata with media data, are described herein. In the following description, for the purposes of explanation, numerous specific details are set forth in order to provide a thorough understanding of the present invention. It will be apparent, however, that the present invention may be practiced without these specific details. In other instances, well-known structures and devices are not described in exhaustive detail, in order to avoid unnecessarily including, obscuring, or obfuscating the present invention.

Example embodiments are described herein according to the following outline:

1. GENERAL OVERVIEW
2. METADATA ALIGNMENT USING MEDIA FINGERPRINTING
3. METADATA ALIGNMENT USING SAMPLE CORRELATION
4. EXAMPLE PROCESS FLOW
5. IMPLEMENTATION MECHANISMS—HARDWARE OVERVIEW
6. EQUIVALENTS, EXTENSIONS, ALTERNATIVES AND MISCELLANEOUS

General Overview

This overview presents a basic description of some aspects of a possible embodiment of the present invention. It should be noted that this overview is not an extensive or exhaustive summary of aspects of the possible embodiment. Moreover, it should be noted that this overview is not intended to be understood as identifying any particularly significant aspects or elements of the possible embodiment, nor as delineating any scope of the possible embodiment in particular, nor the invention in general. This overview merely presents some concepts that relate to the example possible embodiment in a condensed and simplified format, and should be understood as merely a conceptual prelude to a more detailed description of example possible embodiments that follows below.

In some possible embodiments, a media post-processing module may be configured to use metadata to enhance the playback experience of media streams after the streams have been decoded. For example, the media post-processing module may implement post-processing technologies like Dolby's PCEE4 (PC Entertainment Experience Version 4), commercially available from Dolby Laboratories. The post-processing technologies may include volume controlling technologies such as Dolby Volume, commercially available from Dolby Laboratories, which makes the audio volume levels consistent across different songs, TV programs, etc.

In some embodiments, under techniques as described herein, the complexity and/or the delay of audio post-processing may be reduced. For example, certain information about the media stream may be pre-computed and passed as metadata to the media post-processing module, instead of having the media post-processing module re-analyze and re-derive such metadata.

Examples of metadata may include audio events like audio scene changes, which may be an important hint to Dolby Volume that the underlying media data may have changed and thus may require volume adjustment. In some possible embodiments, metadata may be, but is not limited to, dynamic metadata. Dynamic metadata herein may vary over time depending on the media content relating to the media data being played. In some possible embodiments, metadata may include static metadata that does not vary within a relatively long session, such as a whole song.

In some possible embodiments, as illustrated in FIG. 1, the audio post-processing module may be implemented as part of a sound card device driver. For example, in the Windows Operating System, such a module may be implemented as a local-effects (LFX) or global-effects (GFX) audio processing object (APO). A decoder capable of handling metadata may pass the metadata to the media post-processing module for an enhanced playback experience.

In some possible embodiments, the operating environment of the post processing module as described herein does not provide or support sound APIs that allow the passing of metadata by a decoder to a downstream audio processing module such as processing modules on a sound card or equivalent in a first data path in which the sound APIs pass audio (e.g., PCM as illustrated in FIG. 1) samples to the downstream audio processing module. Thus, the sound APIs as provided by the operating environment may only support the passing of audio samples representing audio content of the audio signal without the metadata in the first data path. As used herein, the term "metadata" may refer to both dynamic and static metadata in some possible embodiments, but may refer to only dynamic metadata in some other possible embodiments.

In some possible embodiments, metadata as described herein may be passed in a second different data path. In some possible embodiments, one or more communication channels that are separate from the first data path may be used to establish the second data path between a decoder that generates the metadata from a media stream and the media post-processing module that uses the metadata to enhance the media experience relating to the media stream. For example, the one or more communication channels may be, but are not limited to, one or more operating system supported communication mechanisms such as communication pipes e.g., named pipes, shared memory between the decoder and the audio post-processing module, a messaging queue, etc. In some possible embodiments, a path name similar to a file name may be used for such a communication channel. In some possible embodiments, a communication channel herein may only be read in a FIFO (first-in first-out) manner. In some possible embodiments, a communication channel herein may be read in a random access manner. In some possible embodiments, a communication channel herein may be read in a different order or manner, e.g., with or without seek capabilities.

In some possible embodiments, the decoder and the media post-processing module may be preconfigured (e.g., in a configuration file, hardcoded as a macro in the source code, etc.), or may be dynamically or manually configured with a common path name for a named pipe that is to be served as a communication channel for passing information (including the aforementioned metadata) between the decoder and the media post-processing module. In various possible embodiments, the communication in the second data path may be either uni-directional or bi-directional, or a combination of the two. In some possible embodiments, attributions of the second data path including the directionality of communication may depend on a setting by a user and/or system.

Since dynamic metadata vary as time varies, depending on the media content associated with the media streams, there exists a certain time relationship or correspondence between the metadata and the media samples. When passing the metadata along the second data path and media samples along the first data path, techniques as described herein may be configured to recover the time relationship between the (dynamic or generally any time-sensitive) metadata and media (e.g., audio) samples which relationship would otherwise be lost if the first data path alone is used as the only communication path between the decoder and the media post-processing module. Here, the term "time-sensitive" may refer to a time-synchronous association between the metadata and the media samples in a media bitstream, wherein the time-synchronous association may or may not possibly be recovered from the media samples by the media post-processing module. For example, a time association relating to a user artificially adding/annotating the media stream (e.g., an audio stream) may not possibly be recovered from the audio samples by the audio post-processing module even if so desired, because user annotations/additions of metadata to the media stream may not have any direct semantic relationship with the media content (or audio samples) of the media stream.

In some possible embodiments, a media processing computing device as described herein may be configured to recover the time relationship between a piece of the metadata and one or more audio samples corresponding to the piece of the metadata even when the piece of the metadata and the one or more media samples do not necessarily arrive at the media post-processing module at the same time, due to potentially different time delays in the second data path (e.g., named pipe) and the first data path (e.g., sound APIs).

In some possible embodiments, one, two, or more time associations between dynamic metadata and audio samples relating to one, two, or more media streams may be recovered by a media processing computing device using techniques as described herein. In some possible embodiments, the recovered time associations between the dynamic metadata and media samples may be used by the media post-processing module to enhance media experiences relating to the media streams. For example, in embodiments in which the dynamic metadata controls the activation of some bass enhancement function, if the bass were enhanced where there was not any bass, the unnecessary bass enhancement might distort the sound and create undesirable artifacts. However, under techniques described herein, the dynamic metadata and its time association with the audio sample may be used by an audio post-processing module to determine which audio samples may contain bass and thus to enhance the bass accurately for these audio samples. Additionally and/or optionally, in some possible embodiments, it is desirable to turn on dialogue enhancement algorithms based on metadata that indicates whether the audio content is speech or not. The dynamic metadata and its time association with the audio samples may be used to turn on these algorithms accurately in time for some of the audio samples in which the dynamic metadata indicates the existence of speech.

In some possible embodiments, mechanisms as described herein form a part of a media processing system, including but not limited to: a handheld device, game machine, television, laptop computer, netbook computer, cellular radiotelephone, electronic book reader, point of sale terminal, desktop computer, computer workstation, computer kiosk, various other kinds of terminals and media processing units, etc.

Various modifications to the preferred embodiments and the generic principles and features described herein will be readily apparent to those skilled in the art. Thus, the disclosure is not intended to be limited to the embodiments shown, but is to be accorded the widest scope consistent with the principles and features described herein.

Metadata Alignment Using Media Fingerprinting

In some possible embodiments, media fingerprints (e.g., audio and/or video fingerprints) may be generated as signatures to represent media samples and used by a media post-processing module to recover time association between dynamic metadata and the media samples. The media fingerprints may act as a sequence of media signatures on the media content in two separate times, once at the decoder, and the other time in the media post-processing module.

In an example embodiment, while decoding an audio bitstream, a decoder still knows the time association between metadata from the audio bitstream and audio samples from the same audio bitstream. At the time of decoding, the decoder may generate audio fingerprints from the audio samples decoded from the audio bitstream and bind the audio fingerprints with the dynamic metadata in a data structure, and pass the binding information (which is the information stored in the data structure and comprises dynamic metadata, audio fingerprints, and a time association between the metadata and audio fingerprints) to an audio post-processing module using the second data path. In the meantime, the decoder may pass the decoded audio samples to the audio post-processing module in the first data path (e.g., as provided or supported by sound APIs of the operating system).

In some possible embodiments, the data structure for binding the metadata and media fingerprints (e.g., audio fingerprints) may be implemented as a sequence of media signatures interleaved with metadata with a time association between the media signatures and the metadata. In an example, an element of the sequence of media signatures interleaves with the metadata may comprise a time stamp indicating a time (e.g., from the beginning of a song, the beginning of a movie, from a particular time reference, etc.), one or more media signatures for one or more media samples, and a particular piece of metadata that is time-wise associated with the one or more media samples. Since the one or more media signatures (e.g., fingerprints) may be a digital representation (e.g., a reduced digital representation not equivalent in information density to the represented data) for the one or more media samples, the particular piece of the metadata also has a time association with the one or more media signatures.

In some possible embodiments, the data structure may comprise markings on one or more metadata units in the metadata. These markings may associate the metadata units with their corresponding audio signatures. As used herein, "corresponding audio signatures" may refer to the audio signatures of one or more audio samples that are associated with the metadata units in the time-wise relationship between the metadata and audio samples. In some possible embodiments, one or more portions of the media stream may be associated with static metadata only and may not be associated with any dynamic (or time-sensitive) metadata. It should be noted that other data structures other than a sequence may also be used to store binding information between metadata and media samples (or a representation of the media samples), as long as the binding information discussed above is achieved. For example, instead of a sequence, a linked list may be used to bind the audio signatures of audio samples with metadata units in the metadata. Thus, these and other data structures may be used to store the binding information as described herein.

In some possible embodiments, the media (e.g., audio) post-processing module receives both the media samples and the binding information via two different data paths. As used herein, the term "different data paths" may refer to two data paths, one of which comprises one or more other media processing modules other than the decoder and the media post-processing module and the other of which comprises no other media processing module, but may be formed by one or more non-media specific processing components as provided by the operating environment of the computing device; in some possible embodiments, the metadata, or the binding information as described herein is opaque to the non-media specific processing modules in the second data path. Here, the term "opaque" refers to an inability on the part of the non-media processing modules to make sense of, or perform any media-related processing of, the data that is passing through.

In some possible embodiments, the media post-processing module is configured to generate media fingerprints on the received media samples. In some possible embodiments, additional media processing may be applied to the media samples between the decoder and the media post-processing module in the first data path, for example, by other media processing modules present in the first data path.

In some possible embodiments in which the media samples are audio samples, an example of additional media processing may be playback software applying a night viewing mode to the decoded audio. However, since the audio samples after additional audio processing is perceptually nearly the same as the audio samples before, a second sequence of audio fingerprints generated at the audio post-processing module is identical or nearly identical to audio fingerprints passed along the second data path.

Figure 2:
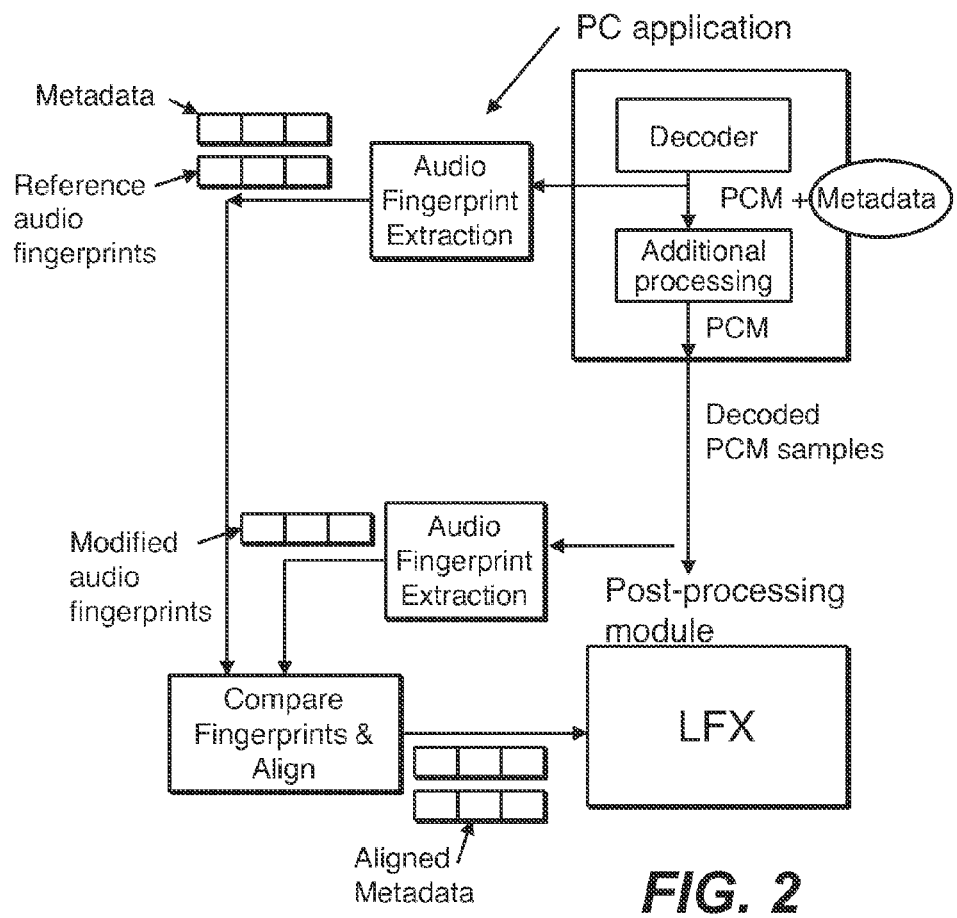
FIG. 2 illustrates example fingerprint-based alignment of metadata and media data, according to possible embodiments of the present invention.

In some possible embodiments, the audio post-processing module is configured to compare the sequence of audio signatures from the second data path (e.g., reference audio fingerprints) to the second sequence of audio signatures (e.g., modified audio fingerprints) itself generated from the audio samples received in the first data path, by time aligning these two sequences (e.g., compare fingerprints and align). The alignment offset that achieves the best match (for example, lowest bit error rate or least Hamming distance) between the two sequences of fingerprints may be considered the best offset for re-establishing time association, as illustrated in FIG. 2. Once the sequences of fingerprints are aligned, the modified sequence of audio signatures derived by the audio post-processing module from the audio samples received in the first data path may be aligned with the metadata received in the second data path. Consequently, the time association between the metadata and the audio samples may be reestablished. As used herein, the term "reestablish" includes establishing, by the media post-processing module, a time association between the metadata and a modified version of the audio samples processed by intermediate media processing modules in the first data path between the decoder and the audio post-processing module. The audio post-processing module may use this time association to perform enhancements when the media content in the audio samples are rendered.

Figure 3:
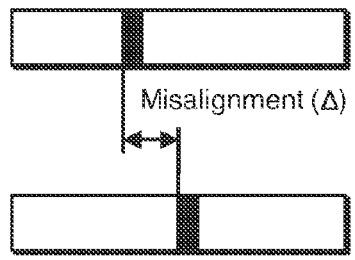
FIG. 3 illustrates example time aligning of two sequences of audio signatures, in accordance with possible embodiments of the present invention.

In some possible embodiments, time aligning the two sequences of media (e.g., for illustration purposes only, audio) signatures may be performed on a given window size with a given offset range, as opposed to time aligning the entire sequence received so far. For example, the audio post-processing module may keep track of the CPU timestamps at which the audio samples and the binding information are received. In some possible embodiments, the audio post-processing module may compare a window of audio signatures derived from the audio samples received in the first data path against a window of audio signatures in the binding information received in the second data path. An offset of zero (0) means the audio signatures in the binding information has a receiving CPU timestamp equal to that of the audio signatures derived from the received audio samples. FIG. 3 illustrates example time aligning of two sequences of audio signatures.

In some possible embodiments, an audio fingerprint comprises audio signatures in a window of a given size. In some embodiments, this window size may be on the order of a second. An offset may refer to audio signatures in an offset range (a time interval) on the order of +/− a fraction of a second. A longer window size (or a longer fingerprint) ensures better uniqueness of an audio fingerprint and more accurate time alignment, but takes longer time to perform the time alignment. A larger offset range provides better chance of finding a correctly aligned offset since the allowed offset is correspondingly larger when the offset range is larger. However, a larger offset range may increase the chance of finding an incorrectly time aligned offset if the window size is too small (which makes an audio fingerprint less unique).

In some possible embodiments, in performing time aligning, out of the window of the received audio signatures and the window of the recomputed audio signatures, one of the two windows may be held fixed, while the other of the two windows is shifted with a given offset range. For example, in a possible embodiment, the window of received audio signatures may be fixed, while the window of the recomputed audio signatures may be shifted with the given offset range. In another possible embodiment, the window of the recomputed audio signatures may be fixed, while the window of the received audio signatures may be shifted within the given offset range.

In some embodiments, after time alignment of the fixed window of audio signatures is complete, the fixed window may advance by a specified interval, which may be equal to the window size itself. In some other embodiments, instead of advancing by the window size, other intervals, including non-constant intervals, may be used.

In some possible embodiments, the time precision (or time resolution) of the re-established time association between the metadata and audio samples may depend on the time granularity of the audio fingerprints, that is, the duration of an audio signature. For example, if the fingerprints are extracted at 10 ms interval, then the best achievable precision of the re-generated time association may be no worse than 10 ms.

Metadata Alignment Using Sample Correlation

In some possible embodiments, to have a relatively high time precision when recovering the time association, techniques as described herein may align metadata using sample correlation on media samples directly instead of media (e.g., audio) fingerprints. For example, a selected sample version of the media samples may be generated at the decoder. The selected sample version of the media samples may include, but is not limited to, a down-sampled version of the media samples. In some embodiments, the decoder may bind the selected sample version of the media samples (instead of media fingerprints) with the dynamic metadata into binding information. The binding information may be delivered to the media post-processing module in the second data path. In some possible embodiments, a data structure for the binding information may be similar to that in the case of the binding information involving media fingerprints.

In some possible embodiments, when receiving the media samples from the first data path, the media post-processing module may apply a sampling procedure the same as or similar to the one used by the decoder, to independently regenerate a selected sample version of the media samples (which may have been additionally media-processed in the first data path). Here, the term "independently" may refer to the selected sample version of the media samples being generated without reference to any other selected sample version of the media samples delivered in the second data path, but rather is generated directly from the media (audio e.g., in PCM format, video, etc.) samples received from the first data path, which may or may not have been additionally media processed in the first data path.

Figure 4:
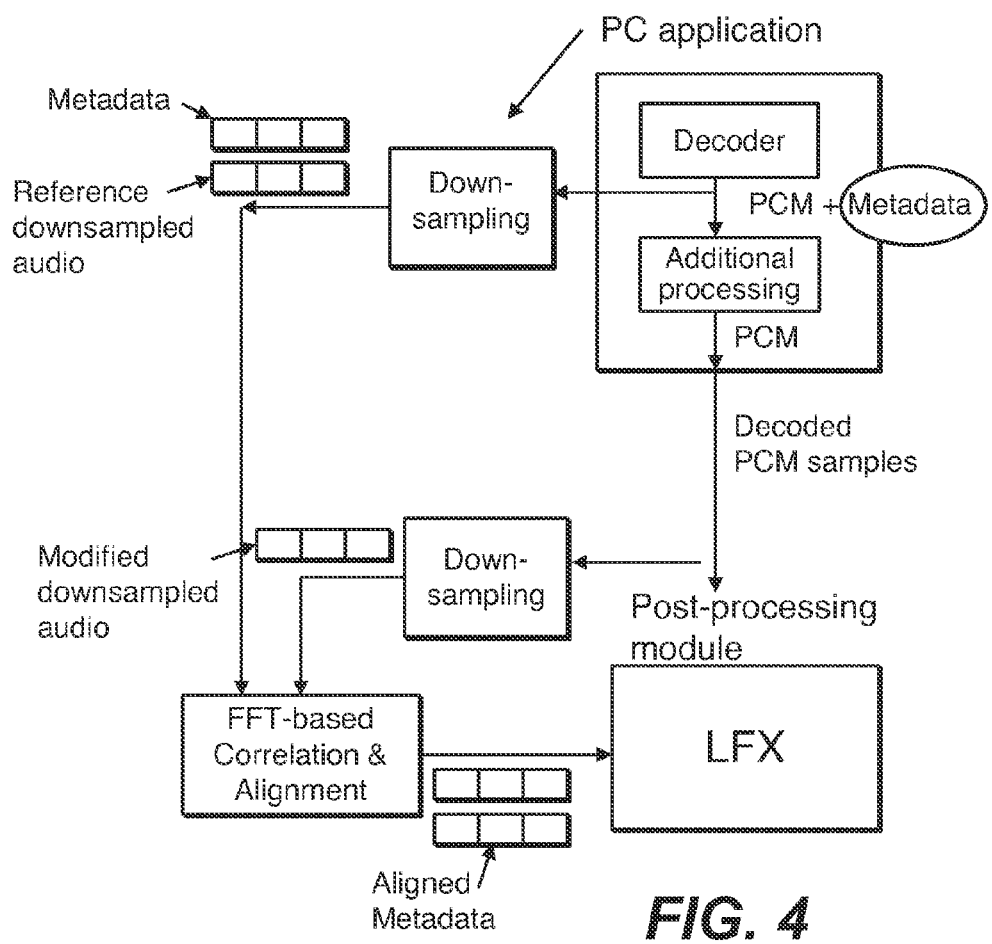
FIG. 4 illustrates example time aligning based on sample correlation, according to possible embodiments of the present invention.

FIG. 4 illustrates example time aligning using the sample correlation. The audio post-processing module may perform sample correlation (e.g., cross correlation) between the two selected sample versions to establish a time correspondence between the delivered selected sample version of the audio samples in the binding information and the regenerated selected sample version of the audio samples, to re-establish the time association between the metadata and the audio samples based on both the time correspondence between the two selected sample versions of the audio samples and the binding information that comprises time correspondence between the metadata and the delivered selected sample version of audio samples, in a similar manner to the time aligning techniques based on audio fingerprints as previously described.

In some possible embodiments, under the time aligning techniques using sample correlation, the best alignment offset may be the one at which the correlation value is highest. With correlation, the time precision may be as high as the sampling frequency of the sampling procedure that generates the selected sample versions of the audio samples. In a possible embodiment, when no down-sampling is performed and thus the audio samples may be passed as-is in the binding information in the second data path, sample correlation may be able to time align the metadata with the audio samples in a higher time precision (or resolution) than with a down-sampled version. As a trade-off, a larger overhead or payload is required for passing the binding information via the second data path.

In some possible embodiments, a measure for the sample correlation may be defined as the sum of products of two sequences at every alignment offset, as follows:

$$Corr(f, g)[t] = \sum_{m=1}^{N} f(m)g(t+m),$$

$$t = -N+1, -N+2, \ldots, 0, \ldots, N-2, N-1.$$

For a sequence of N samples of data, this requires $O(N^2)$ multiply and add operations. For range outside [1,N], sequence f( . . . ) and g( . . . ) may be defined as zero. To reduce computational overhead, one may use the similarity between correlation and convolution, based on that convolution in the time domain is equivalent to element-wise multiplication in the fourier domain. Thus, in some possible embodiments, one may use FFT (fast Fourier transform) to evaluate sample correlation. For example, one of the two sequences may be time-reversed initially. FFT may then be applied to both sequences. An element-wise multiplication in the FFT domain may be performed. Inverse-FFT followed by a linear shift may be performed to obtain the sample correlation output as set forth above. In an example, the following procedure may be used. It should be noted that there are other procedures that achieve the same or similar outcome. Convolution in discrete sequence may be defined as follows:

$$\text{Conv}(f, g)[t] = \sum_{m=1}^{N} f(m)g(t-m)$$

Thus, a relation exists between the above sample correlation and the above convolution as follows:

$$\text{Corr}(f, g)[t] = \text{Conv}(f, g_r)[N-t]$$

where $g_r[t] = g[N-t]$

Thus, the sample correlation may be performed by FFT and inverse FFT as follows:

$$\text{Conv}(f, g) = \text{iFFT}(\text{FFT}(f, 2N) * \text{FFT}(g, 2N))$$

where * denotes an element-wise multiplication for f and g in the Fourier domain. Since the sample correlation has 2N−1 values of t, the FFT size is 2N. For reasons of achieving a relatively high efficiency, N (and 2N) may be selected as an integer number of a power of 2. This is so because the FFT computation may be required to zero-pad f and g to a length of the nearest-up power of 2 if N is not already a power of 2.

Example Process Flow

Figure 5:
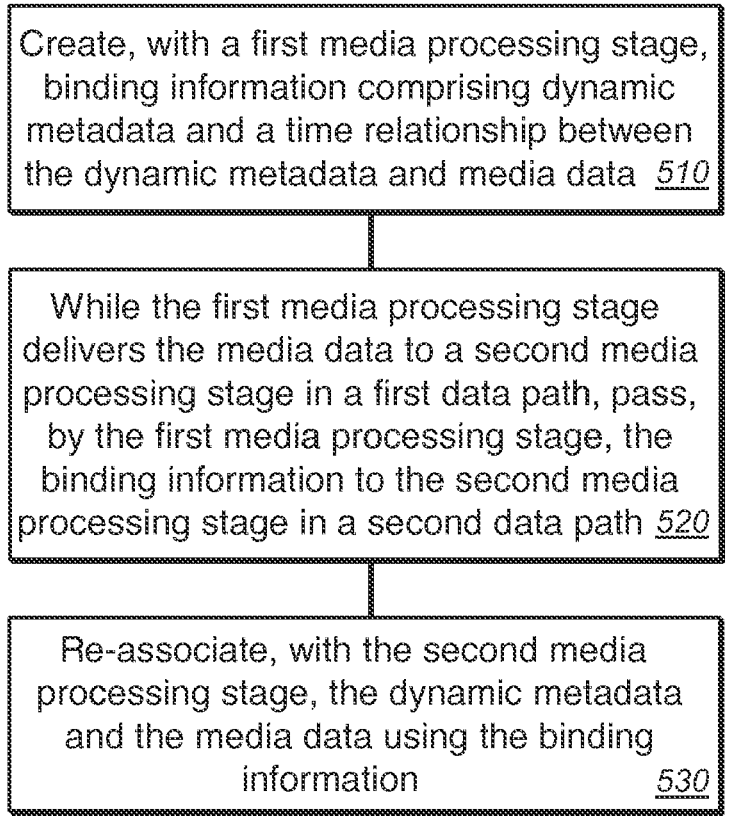
FIG. 5 illustrates an example process flow, according to possible embodiments of the present invention.

FIG. 5 illustrates an example process flow according to a possible embodiment of the present invention. In some possible embodiments, one or more computing devices or components in a media processing system may perform this process flow.

In block 510 of FIG. 5, a media processing system (e.g., a computer that hosts one or more media processing applications) creates, with a first media processing stage (e.g., a decoder), binding information comprising dynamic metadata and a time relationship between the dynamic metadata and media data. The binding information may be derived from the media data.

In block 520, while the first media processing stage delivers the media data (audio samples e.g., in PCM, video samples, etc.) to a second media processing stage (e.g., a media post-processing stage such as LFX) in a first data path, the first media processing stage passes the binding information to the second media processing stage in a second data path.

In block 530, the media processing system may re-associate, with the second media processing stage, the dynamic metadata in the binding information and the media data received by the second media processing stage in the second data path, using the binding information.

In some possible embodiments, the first data path comprises one or more intermediate media processing entities that perform one or more media-specific functions, while in the second data path the first media processing stage and the second media processing stage are the only processing entities that perform any media-specific function.

In some possible embodiments, the second data path may comprise one or more generic communication channels between the first media processing stage and the second media processing stage. The one or more generic communication channels may be non media-specific communication facilities provided by an operating environment of the one or more computing devices.

In some possible embodiments, to create binding information, the media processing system may derive, with the first media processing stage, one or more fingerprints from a first version of the media data. The media processing system may create the time relationship between the dynamic metadata and the media data as one or more time correspondences between one or more units of the dynamic metadata and the one or more fingerprints derived from the first version of the media data. The media processing system may store the one or more fingerprints in the binding information along with the dynamic metadata and the time relationship. To re-associate the dynamic metadata and the media data, the media processing system may regenerate, with the second media processing stage, one or more second fingerprints from a second version of the media data delivered in the first data path. The media processing system may time align the one or more fingerprints received in the second data path with the one or more second fingerprints regenerated with the second media processing stage.

In some possible embodiments, the second version of the media data may comprise one or more non-metadata media data units unmodified from the first version of the media data.

In some possible embodiments, one or more non-metadata media data units of the first version of the media data may be modified with one or more intermediate media processing entities in the first data path into one or more second non-metadata media data units of the second version of the media data.

In some possible embodiments, the one or more fingerprints are pre-generated, for example, by an external media processing system other than the media processing system. The fingerprints may be stored in the media data with an external media processing stage in the external media processing system. Thus, when the media data is received, for example, in a bitstream, the pre-generated fingerprints may be embedded in the bitstream and may be extracted therefrom by a decoder in the media processing system that performs the process flow of FIG. 5.

In some possible embodiments, the one or more second fingerprints may be re-generated with the second media processing stage using a same computation method that is used to generate the one or more fingerprints derived from the first version of the media data.

In some possible embodiments, at least one of the one or more fingerprints comprises a sequence of signatures computed from one or more samples of the media data over a time interval. For example, a hash-based signature may be computed for a media sample as a reduced digital representation of the media sample. A fingerprint may be formed by the sequence of signatures computed for media frames in the time interval.

In some possible embodiments, the one or more fingerprints may form a time sequence of fingerprints that relate to a temporal aspect of a first version of the media data.

In some possible embodiments, to time align the one or more fingerprints received in the second data path with the one or more second fingerprints, the media processing system may determine similarity between the one or more fingerprints and the one or more second fingerprints. The similarity may be determined with one or more Hamming distances between the one or more fingerprints and the one or more second fingerprints, with a smaller Hamming distance corresponding to more similarity.

In some possible embodiments, the similarity may be determined with one or more bit error rates between the one or more fingerprints and the one or more second fingerprints, with a lower bit error rate corresponding to more similarity.

In some possible embodiments, to create binding information, the media processing system may derive, with the first media processing stage, one or more media samples from a first version of the media data. The media processing system may create the time relationship between the dynamic metadata and the media data as one or more time correspondences between one or more units of the dynamic metadata and the one or more media samples derived from the first version of the media data. The media processing system may store the one or more media samples in the binding information along with the dynamic metadata and the time relationship. To re-associate the dynamic metadata and the media data, the media processing system may regenerate, with the second media processing stage, one or more second media samples from a second version of the media data delivered in the first data path, and time align the one or more media samples received in the second data path with the one or more second media samples regenerated with the second media processing stage. In some possible embodiments, the second version of the media data comprises one or more non-metadata media data units unmodified from the first version of the media data. In some possible embodiments, one or more intermediate media processing entities in the first data path modify one or more non-metadata media data units of the first version of the media data into one or more second non-metadata media data units of the second version of the media data. In some possible embodiments, the second media processing stage regenerates the one or more second media samples using a same computation method that is used to generate the one or more media samples derived from the first version of the media data. In some possible embodiments, to time align the one or more media samples received in the second data path with the one or more second media samples, the media processing system may perform a sample correlation between the one or more media samples and the one or more second media samples.

In some possible embodiments, to create binding information, the media processing system creates the time relationship between the dynamic metadata and the media data as one or more time correspondences between one or more units of the dynamic metadata and one or more non-metadata media data units of a first version of the media data, and stores the one or more units of the first version of the media data in the binding information along with the dynamic metadata and the time relationship. To re-associate the dynamic metadata and the media data, the media processing system may time align the one or more non-metadata media data units of the first version of the media data received in the second data path with one or more second non-metadata media data units of a second version of the media data received in the first data path. In some possible embodiments, the one or more second non-metadata media data units are substantially similar to the one or more non-metadata media data units of the first version of the media data. In some possible embodiments, one or more intermediate media processing entities in the first data path modify the one or more non-metadata media data units of the first version of the media data into the one or more second non-metadata media data units of the second version of the media data. In some possible embodiments, to time align the one or more units of the first version of the media data with one or more second units of a second version of the media data, the media processing system performs a sample correlation between the one or more units of the first version of the media data with the one or more second units of the second version of the media data.

In some possible embodiments, the first media processing stage comprises a decoder that decodes input from a media stream into the media data, while the second media processing stage comprises a media driver of media presentation hardware.

In some possible embodiments, the second media processing stage is configured to use the dynamic metadata to maintain one or more audio outputs in consistent volume.

In some possible embodiments, the dynamic metadata is used with the second media processing stage to maintain audio output in consistent volume.

In some possible embodiments, the second media processing stage is configured to alter one or more characteristics for a certain portion of the media data using the dynamic metadata.

In some possible embodiments, the one or more characteristics comprise one or more bass-related characteristics for the certain portion of the media data relating to audio.

In some possible embodiments, the one or more characteristics comprise one or more speech-related characteristics for the certain portion of the media data relating to audio.

In some possible embodiments, the one or more characteristics comprise one or more dynamic range-related characteristics for the certain portion of the media data relating to audio.

In some possible embodiments, the media data relates to one or more of audio, video, audiovisual, multimedia slides, sequences of mixed media objects, movies, media files, scores, songs, etc.

In some possible embodiments, the binding information comprises one or more of data structures, arrays, sequences, linked lists, trees, queues, messages, etc.

Implementation Mechanisms—Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

Figure 6:
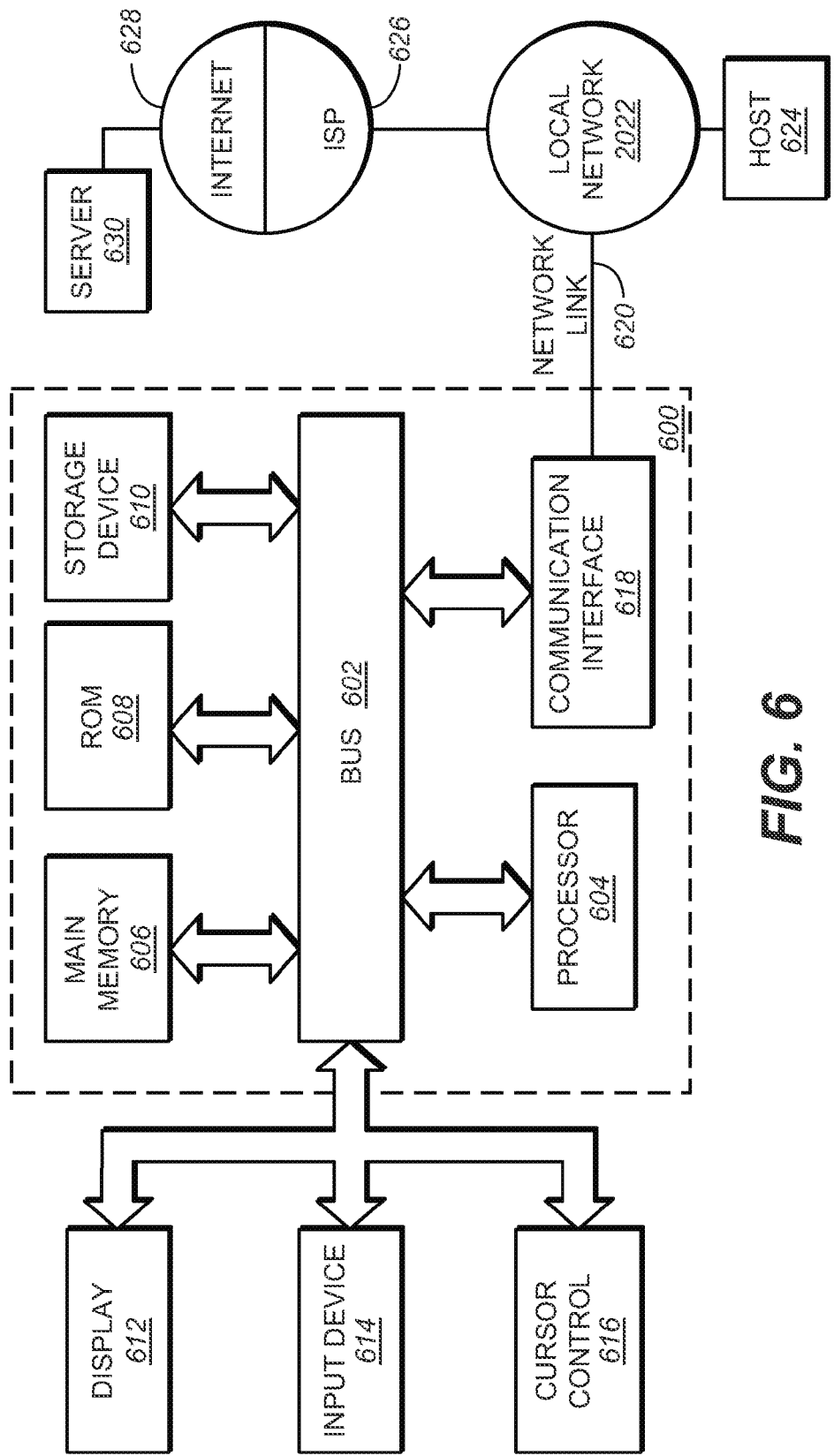
FIG. 6 illustrates an example hardware platform on which a computer or a computing device as described herein may be implemented, according a possible embodiment of the present invention.

For example, FIG. 6 is a block diagram that illustrates a computer system 600 upon which an embodiment of the invention may be implemented. Computer system 600 includes a bus 602 or other communication mechanism for communicating information, and a hardware processor 604 coupled with bus 602 for processing information. Hardware processor 604 may be, for example, a general purpose microprocessor.

Computer system 600 also includes a main memory 606, such as a random access memory (RAM) or other dynamic storage device, coupled to bus 602 for storing information and instructions to be executed by processor 604. Main memory 606 also may be used for storing temporary variables or other intermediate information during execution of instructions to be executed by processor 604. Such instructions, when stored in storage media accessible to processor 604, render computer system 600 into a special-purpose machine that is customized to perform the operations specified in the instructions.

Computer system 600 further includes a read only memory (ROM) 608 or other static storage device coupled to bus 602 for storing static information and instructions for processor 604. A storage device 610, such as a magnetic disk or optical disk, is provided and coupled to bus 602 for storing information and instructions.

Computer system 600 may be coupled via bus 602 to a display 612 for displaying information to a computer user. An input device 614, including alphanumeric and other keys, is coupled to bus 602 for communicating information and command selections to processor 604. Another type of user input device is cursor control 616, such as a mouse, a trackball, or cursor direction keys for communicating direction information and command selections to processor 604 and for controlling cursor movement on display 612. This input device typically has two degrees of freedom in two axes, a first axis (e.g., x) and a second axis (e.g., y), that allows the device to specify positions in a plane. Computer system 600 may be used to control the media processing system. In some possible embodiments, display 612 is the same as display 100. In some other embodiments, display 612 may be a separate display to the media processing system 100.

Computer system 600 may implement the techniques described herein using customized hard-wired logic, one or more ASICs or FPGAs, firmware and/or program logic which in combination with the computer system causes or programs computer system 600 to be a special-purpose machine. According to one embodiment, the techniques herein are performed by computer system 600 in response to processor 604 executing one or more sequences of one or more instructions contained in main memory 606. Such instructions may be read into main memory 606 from another storage medium, such as storage device 610. Execution of the sequences of instructions contained in main memory 606 causes processor 604 to perform the process steps described herein. In alternative embodiments, hard-wired circuitry may be used in place of or in combination with software instructions.

The term "storage media" as used herein refers to any media that store data and/or instructions that cause a machine to operation in a specific fashion. Such storage media may comprise non-volatile media and/or volatile media. Non-volatile media includes, for example, optical or magnetic disks, such as storage device 610. Volatile media includes dynamic memory, such as main memory 606. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 602. Transmission media can also take the form of acoustic or light waves, such as those generated during radio-wave and infra-red data communications.

Various forms of media may be involved in carrying one or more sequences of one or more instructions to processor 604 for execution. For example, the instructions may initially be carried on a magnetic disk or solid state drive of a remote computer. The remote computer can load the instructions into its dynamic memory and send the instructions over a telephone line using a modem. A modem local to computer system 600 can receive the data on the telephone line and use an infra-red transmitter to convert the data to an infra-red signal. An infra-red detector can receive the data carried in the infra-red signal and appropriate circuitry can place the data on bus 602. Bus 602 carries the data to main memory 606, from which processor 604 retrieves and executes the instructions. The instructions received by main memory 606 may optionally be stored on storage device 610 either before or after execution by processor 604.

Computer system 600 also includes a communication interface 618 coupled to bus 602. Communication interface 618 provides a two-way data communication coupling to a network link 620 that is connected to a local network 622. For example, communication interface 618 may be an integrated services digital network (ISDN) card, cable modem, satellite modem, or a modem to provide a data communication connection to a corresponding type of telephone line. As another example, communication interface 618 may be a local area network (LAN) card to provide a data communication connection to a compatible LAN. Wireless links may also be implemented. In any such implementation, communication interface 618 sends and receives electrical, electromagnetic or optical signals that carry digital data streams representing various types of information.

Network link 620 typically provides data communication through one or more networks to other data devices. For example, network link 620 may provide a connection through local network 622 to a host computer 624 or to data equipment operated by an Internet Service Provider (ISP) 626. ISP 626 in turn provides data communication services through the world wide packet data communication network now commonly referred to as the "Internet" 628. Local network 622 and Internet 628 both use electrical, electromagnetic or optical signals that carry digital data streams. The signals through the various networks and the signals on network link 620 and through communication interface 618, which carry the digital data to and from computer system 600, are example forms of transmission media.

Computer system 600 can send messages and receive data, including program code, through the network(s), network link 620 and communication interface 618. In the Internet example, a server 630 might transmit a requested code for an application program through Internet 628, ISP 626, local network 622 and communication interface 618. The received code may be executed by processor 604 as it is received, and/or stored in storage device 610, or other non-volatile storage for later execution.

Equivalents, Extensions, Alternatives and Miscellaneous

In the foregoing specification, possible embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

For the purpose of illustration, recovering (or re-associating) a time association between metadata and audio samples has been illustrated. It should be noted that techniques as described herein may apply to other media data. For example, instead of audio samples, techniques as described herein may be applied to recover a time relationship between metadata and video samples, or audiovisual samples, in various possible embodiments of the present invention. For example, media fingerprints and/or a selected sample version of media data may be extracted/generated. Binding information containing the media fingerprints and/or the selected sample version of the media data and the time relationship thereof may be delivered in a second different data path to a media post-processing module, where the second different data path may be separate from a first data path along which the media data is delivered to various media processing modules. Time aligning the fingerprints and /or the selected sample version of the media data with the media data may be performed in the same manner as described above in connection with the audio samples. Accordingly, a time association between the metadata and the media data may be recovered. In a particular embodiment, sample correlation may be performed on a representation of a video signal, such as the bitmaps of a sequence of video frames. In some possible embodiments, since video media data may have a much higher data rate than audio data, relatively significant down-sampling (e.g., temporally in frame rate, or spatially in resolution, or both) and/or video fingerprints (which are usually highly compact representations of video) may be used to reduce the size of the binding information passed in the second data path.

For the purpose of illustration, reference to dynamic metadata may have been used. It should be noted that, for the purpose of the present invention, other properties of the media data, inherent or acquired, time-sensitive or relatively time stable, may be generated in connection with media data. Furthermore, these properties and their time associations with the media data may be delivered to a media post processing module in a second data path other than a first data path that is used for media processing by various media processing modules.

What is claimed is:

1. A method for re-associating dynamic metadata with media data:
creating, with a first media processing stage, binding information comprising dynamic metadata and a time relationship between the dynamic metadata and media data, the binding information being derived from the media data;
while the first media processing stage delivers the media data to a second media processing stage in a first data path, passing, by the first media processing stage, the binding information to the second media processing stage in a second data path; and
re-associating, with the second media processing stage, the dynamic metadata and the media data using the binding information;
wherein creating binding information includes:
deriving, with the first media processing stage, one or more fingerprints from a first version of the media data;
creating the time relationship between the dynamic metadata and the media data as one or more time correspondences between one or more units of the dynamic metadata and the one or more fingerprints derived from the first version of the media data;
storing the one or more fingerprints in the binding information along with the dynamic metadata and the time relationship; and
wherein re-associating the dynamic metadata and the media data includes:
regenerating, with the second media processing stage, one or more second fingerprints from a second version of the media data delivered in the first data path;
time aligning the one or more fingerprints received in the second data path with the one or more second fingerprints regenerated with the second media processing stage;
wherein the method is performed by one or more computing devices.

2. The method of claim 1, wherein the first data path comprises one or more intermediate media processing entities that perform one or more media-specific functions, and wherein the second data path only comprises the first media processing stage and the second media processing stage as processing entities that perform any media-specific function.

3. The method of claim 2, wherein the second data path comprises one or more generic communication channels between the first media processing stage and the second media processing stage, and wherein the one or more generic communication channels are non media-pecific communication facilities provided by an operating environment of the one or more computing devices.

4. The method of claim 1, wherein the second version of the media data comprises one or more non-metadata media data units unmodified from the first version of the media data.

5. The method of claim 1, wherein one or more non-metadata media data units of the first version of the media data is modified with one or more intermediate media processing entities in the first data path into one or more second non-metadata media data units of the second version of the media data.

6. The method of claim 1, wherein the one or more fingerprints are pre-generated and stored in the media data with an external media processing stage, and wherein the external media processing stage is external to the one or more computing devices.

7. The method of claim 1, wherein the one or more second fingerprints are re-generated with the second media processing stage using a same computation method that is used to generate the one or more fingerprints derived from the first version of the media data.

8. The method of claim 1, wherein at least one of the one or more fingerprints comprises a sequence of signatures computed from one or more samples of the media data over a time interval.

9. The method of claim 1, wherein the one or more fingerprints form a time sequence of fingerprints that relate to a temporal aspect of a first version of the media data.

10. The method of claim 1, wherein time aligning the one or more fingerprints received in the second data path with the one or more second fingerprints includes determining similarity between the one or more fingerprints and the one or more second fingerprints.

11. The method of claim 10, wherein the similarity comprises a determination with one or more Hamming distances between the one or more fingerprints and the one or more second fingerprints.

12. The method of claim 10, wherein the similarity comprises a determination with one or more lowest bit error rates between the one or more fingerprints and the one or more second fingerprints.

13. The method of claim 1, wherein creating binding information includes:
creating the time relationship between the dynamic metadata and the media data as one or more time correspondences between one or more units of the dynamic metadata and one or more non-metadata media data units of a first version of the media data;
storing the one or more non-metadata media data units of the first version of the media data in the binding information along with the dynamic metadata and the time relationship; and
wherein re-associating the dynamic metadata and the media data includes:
time aligning the one or more non-metadata media data units of the first version of the media data received in the second data path with one or more second non-metadata media data units of a second version of the media data received in the first data path.

14. The method of claim 13, wherein the one or more second non-metadata media data units are similar to the one or more non-metadata media data units of the first version of the media data.

15. The method of claim 13, wherein one or more intermediate media processing entities in the first data path modify the one or more non-metadata media data units of the first version of the media data into the one or more second non-metadata media data units of the second version of the media data.

16. The method of claim 1, wherein the first media processing stage comprises a decoder that decodes input from a media stream into the media data.

17. The method of claim 1, wherein the second media processing stage comprises a media driver of media presentation hardware.

18. The method of claim 1, wherein the second media processing stage is configured to use the dynamic metadata to maintain one or more audio outputs in consistent volume.

19. The method of claim 1, wherein the dynamic metadata is used with the second media processing stage to maintain audio output in consistent volume.

20. The method of claim 1, wherein the second media processing stage is configured to alter one or more characteristics for a certain portion of the media data using the dynamic metadata.

21. The method of claim 20, wherein the one or more characteristics comprise one or more base-related characteristics for the certain portion of the media data relating to audio.

22. The method of claim 20, wherein the one or more characteristics comprise one or more speech-related characteristics for the certain portion of the media data relating to audio.

23. The method of claim 20, wherein the one or more characteristics comprise one or more dynamic range-related characteristics for the certain portion of the media data relating to audio.

24. The method of claim 1, wherein the media data relates to one or more of audio, video, audiovisual, multimedia slides, sequences of mixed media objects, movies, media files, scores, or songs.

25. The method of claim 1, wherein the binding information comprises one or more of data structures, arrays, sequences, linked lists, trees, queues, or messages.

26. A system for re-associating dynamic metadata with media data, the system comprising:
  means for creating, with a first media processing stage, binding information comprising dynamic metadata and a time relationship between the dynamic metadata and media data, the binding information being derived from the media data;
  means for passing the binding information, by the first media processing stage to a second media processing stage in a second data path, while the first media processing stage delivers the media data to the second media processing stage in a first data path; and
  means for re-associating, with the second media processing stage, the dynamic metadata and the media data using the binding information;
  wherein the means for creating binding information includes:
    means for deriving, with the first media processing stage, one or more fingerprints from a first version of the media data;
    means for creating the time relationship between the dynamic metadata and the media data as one or more time correspondences between one or more units of the dynamic metadata and the one or more fingerprints derived from the first version of the media data;
    means for storing the one or more fingerprints in the binding information along with the dynamic metadata and the time relationship; and
  wherein the means for re-associating the dynamic metadata and the media data includes:
    means for regenerating, with the second media processing stage, one or more second fingerprints from a second version of the media data delivered in the first data path;
    means for time aligning the one or more fingerprints received in the second data path with the one or more second fingerprints regenerated with the second media processing stage.

27. An apparatus for re-associating dynamic metadata with media data, the system, the apparatus comprising:
  a processor; and
  a computer readable storage medium that comprises instructions, which when executed or performed by the processor, program, control, cause or configure the processor to perform a process, which comprises:
    creating, with a first media processing stage, binding information comprising dynamic metadata and a time relationship between the dynamic metadata and media data, the binding information being derived from the media data;
    while the first media processing stage delivers the media data to a second media processing stage in a first data path, passing, by the first media processing stage, the binding information to the second media processing stage in a second data path; and
    re-associating, with the second media processing stage, the dynamic metadata and the media data using the binding information;
    wherein creating binding information includes:
      deriving, with the first media processing stage, one or more fingerprints from a first version of the media data;
      creating the time relationship between the dynamic metadata and the media data as one or more time correspondences between one or more units of the dynamic metadata and the one or more fingerprints derived from the first version of the media data;
      storing the one or more fingerprints in the binding information along with the dynamic metadata and the time relationship; and
    wherein re-associating the dynamic metadata and the media data includes:
      regenerating, with the second media processing stage, one or more second fingerprints from a second version of the media data delivered in the first data path;
      time aligning the one or more fingerprints received in the second data path with the one or more second fingerprints regenerated with the second media processing stage.

28. A non-transitory computer readable storage medium, comprising instructions, which when executed by one or more processors cause, program, control or configure the processors to execute or perform a process, which comprises:
- creating, with a first media processing stage, binding information comprising dynamic metadata and a time relationship between the dynamic metadata and media data, the binding information being derived from the media data;
- while the first media processing stage delivers the media data to a second media processing stage in a first data path, passing, by the first media processing stage, the binding information to the second media processing stage in a second data path; and
- re-associating, with the second media processing stage, the dynamic metadata and the media data using the binding information;
- wherein creating binding information includes:
  - deriving, with the first media processing stage, one or more fingerprints from a first version of the media data;
  - creating the time relationship between the dynamic metadata and the media data as one or more time correspondences between one or more units of the dynamic metadata and the one or more fingerprints derived from the first version of the media data;
  - storing the one or more fingerprints in the binding information along with the dynamic metadata and the time relationship; and
- wherein re-associating the dynamic metadata and the media data includes:
  - regenerating, with the second media processing stage, one or more second fingerprints from a second version of the media data delivered in the first data path;
  - time aligning the one or more fingerprints received in the second data path with the one or more second fingerprints regenerated with the second media processing stage.

29. The medium of claim 28, wherein the second media processing stage is configured to alter one or more characteristics for a certain portion of the media data using the dynamic metadata.

30. The medium of claim 28, wherein the second media processing stage comprises a media driver of media presentation hardware.

31. The system of claim 26, wherein the second media processing stage is configured to alter one or more characteristics for a certain portion of the media data using the dynamic metadata.

32. The system of claim 26, wherein the second media processing stage comprises a media driver of media presentation hardware.

33. The apparatus of claim 27, wherein the second media processing stage is configured to alter one or more characteristics for a certain portion of the media data using the dynamic metadata.

34. The apparatus of claim 27, wherein the second media processing stage comprises a media driver of media presentation hardware.

* * * * *